(12) United States Patent
Grebennikov et al.

(10) Patent No.: US 10,601,375 B2
(45) Date of Patent: Mar. 24, 2020

(54) MODIFIED THREE-STAGE DOHERTY AMPLIFIER

(71) Applicant: SUMITOMO ELECTRIC DEVICE INNOVATIONS, INC., Kanagawa (JP)

(72) Inventors: Andrey Grebennikov, Herts (GB); James Wong, Surrey (GB); Naoki Watanabe, London (GB)

(73) Assignee: SUMITOMO ELECTRONIC DEVICES INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/150,156

(22) Filed: Oct. 2, 2018

(65) Prior Publication Data
US 2019/0103842 A1 Apr. 4, 2019

Related U.S. Application Data

(60) Provisional application No. 62/567,519, filed on Oct. 3, 2017.

(51) Int. Cl.
*H03F 1/07* (2006.01)
*H03F 1/02* (2006.01)
(Continued)

(52) U.S. Cl.
CPC .......... *H03F 1/0288* (2013.01); *H03F 1/56* (2013.01); *H03F 3/21* (2013.01); *H03F 2200/387* (2013.01)

(58) Field of Classification Search
CPC .................. H03F 1/07; H03F 1/0288
(Continued)

(56) References Cited

U.S. PATENT DOCUMENTS 8,022,760 B2 * 9/2011 Gajadharsing ........ H03F 1/0288
 330/124 R
8,274,332 B2 * 9/2012 Cho ...................... H03F 1/0261
 330/295

(Continued)

OTHER PUBLICATIONS

Srirattana, Nuttapong, et al., Analysis and Design of a High-Efficiency Multistage Doherty Power Amplifier for Wireless Communication, *IEEE Transactions on Microwave Theory & Techniques*, vol. 53, No. 3, Mar. 2005.

Primary Examiner — Henry Choe
(74) Attorney, Agent, or Firm — Smith, Gambrell & Russell, LLP

(57) ABSTRACT

A 3-stage Doherty amplifier that includes a three-way splitter, a carrier amplifier, first to second peak amplifiers, and an output combiner is disclosed. The output combiner includes first to fifth transmission lines with a λ/4 electrical length except for that in a downstream of the second peak amplifier, which provides a λ/2 electrical length. By dividing the latter transmission line into two parts each having a λ/4 length, and setting impedance thereof in a relation of $(Z_1/Z_3)^2 \times (Z_L/3)$, the output impedance of the respective amplifiers are common to each other to be $Z_o$, where $Z_1$, $Z_3$, and $Z_L$ are impedance of the transmission liens in respective downstream sides of the amplifiers, that of the transmission line provided in the output, and the load impedance, respectively.

9 Claims, 3 Drawing Sheets

(51) Int. Cl.
*H03F 1/56* (2006.01)
*H03F 3/21* (2006.01)

(58) Field of Classification Search
USPC .............................................. 330/124 R, 295
See application file for complete search history.

(56) References Cited

U.S. PATENT DOCUMENTS

| | | | | |
|---|---|---|---|---|
| 8,346,189 | B2* | 1/2013 | Dupuy | H03F 1/0222 |
| | | | | 330/124 R |
| 8,564,367 | B2* | 10/2013 | Svechtarov | H03F 1/0288 |
| | | | | 330/124 R |
| 10,187,015 | B2* | 1/2019 | Grebennikov | H03F 3/602 |
| 2012/0126890 | A1* | 5/2012 | Svechtarov | H03F 1/0288 |
| | | | | 330/124 R |
| 2015/0333706 | A1* | 11/2015 | Blednov | H03F 1/0288 |
| | | | | 455/114.3 |

* cited by examiner

MODIFIED THREE-STAGE DOHERTY AMPLIFIER

CROSS REFERENCE TO RELATED APPLICATION

This application claims benefit of U.S. Provisional Application No. 62/567,519, filed Oct. 3, 2017, the contents of which are incorporated by reference herein.

BACKGROUND OF INVENTION

1. Field of Invention

The present invention relates to a modification of a three-stage Doherty amplifier.

2. Related Background Arts

In modern telecommunication systems, it is required that the power amplifier could deliver a wide range of output powers with high efficiency and high linearity. Generally, being designed for the highest power level with maximum available efficiency, the power amplifiers in base stations tend to operate less efficiently at lower power levels consuming a lot of extra DC power. Besides, in those systems with an increased bandwidth and a high data rate, the transmitting signal is characterized by high peak-to-average power ratio due to wide and rapid variations of the instantaneous transmitting power. Therefore, it is a real challenge to design a power amplifier for a base station that has high efficiency not only at maximum output power but also at lower power levels typically ranging from −6 dB and smaller, with a minimum size and a lower cost of implementation.

N. Srirattana et. al has reported in IEEE Trans. Microwave Theory Technology, volume MTT-53, pages 852-860, March 2005, that the efficiency of a two-stage Doherty amplifier that provides a carrier amplifier and a single peak amplifier may be increased by extending the configuration thereof into a 3-stage Doherty amplifier by adding a second peak amplifier, which brings serious benefit when input signals have large peak-to-average ratios. One subject left in a conventional three-stage Doherty amplifier is that the load-line impedance seen by the carrier amplifier at lower power back-off causes heavy saturation of the carrier amplifier and, consequently, a significant degradation of the linearity between the input and the output of the Doherty amplifier. A typical technique for avoiding this degradation is to use complicated drive profiles at the input, thereby increasing the complexity of the input splitter. Another subject is that, in a case where the carrier amplifier and the peak amplifier have device sizes and configurations equal to each other, marginal improvement is obtained relative to the symmetrical two-stage Doherty amplifier. This requires selection of different transistor sizes and results in complicated device selection procedures.

SUMMARY OF INVENTION

An aspect of the present invention relates to a three-stage Doherty amplifier that includes a three-way splitter, a carrier amplifier, a first and second peak amplifiers, and an output combiner. The three-way splitter splits an input signal evenly into three portions. The carrier amplifier receives one of the portions of the input signal split by the three-way splitter and always turns on for the input signal. The first and second peak amplifiers receive the respective portions of the input signal split by the three-way splitter. The first peak amplifier turns on when the input signal in power thereof becomes greater than a first back-off point. The second peak amplifier turns on when the input signal in the power thereof becomes greater than a second back-off point that is greater than the first back-off point. The output combiner includes first to fifth output transmission lines, where the first to third output transmission lines are provided in downstream sides of the respective amplifiers. The fourth output transmission line is provided in a downstream side of the second output transmission line and the third output transmission line. The fifth output transmission line is provided in a downstream side of the first output transmission line and the fourth output transmission line. A feature of the Doherty amplifier of the embodiment is that the first to fifth output transmission lines except for the third output transmission line have an electrical length of a quarter-wavelength ($\lambda/4$); while, the third transmission line has an electrical length of a half-wavelength ($\lambda/2$), where $\lambda$ is a wavelength of the input signal.

DESCRIPTION OF DRAWINGS

The present disclosure may be better understood, and its numerous objects, features, and advantages made apparent to those skilled in the art by referencing the accompanying drawings.

DESCRIPTION OF EMBODIMENT

Figure 1:
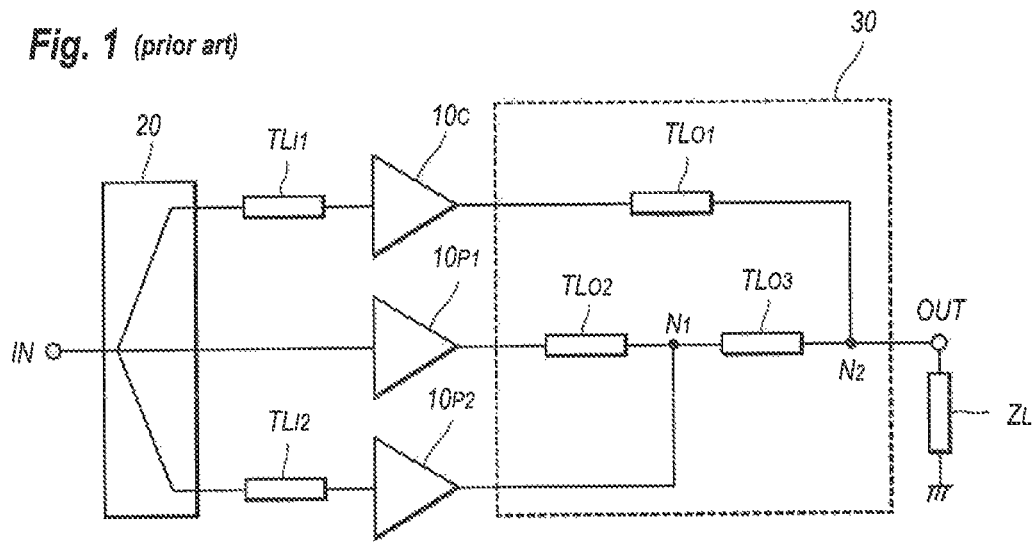
FIG. 1 schematically shows a conventional three-stage Doherty amplifier.

FIG. 1 shows the schematic of a three-stage Doherty amplifier configuration disclosed in U.S. Pat. No. 8,022,760, where the output combiner 30 implements a phase shift of 90° between an output of a carrier amplifier $10_C$ and an amplifier output OUT, a phase shift of 180° between an output of a first peak amplifier $10_{P1}$ and the amplifier output OUT, and a phase shift of 90° between an output of a second peak amplifier $10_{P2}$ and the amplifier output OUT.

Thus, the output combiner 30 consists of the first quarter-wave ($\lambda/4$) transmission line $TL_{O1}$ connected between the output of the carrier amplifier $10_C$ and the amplifier output OUT, a second $\lambda/4$ transmission line $TL_{O2}$ connected between the output of the first peak amplifier $10_{P1}$ and the output of the second peak amplifier $10_{P2}$, and a third $\lambda/4$ transmission line connected between the output of the second peak amplifier $10_{P2}$ and the amplifier output OUT when the output of the second peak amplifier $10_{P2}$ is directly connected with a node $N_1$ between the second $\lambda/4$ transmission line $TL_{O2}$ and the third $\lambda/4$ transmission line TLo6.

The $\lambda/4$ transmission line $TL_{I1}$ between a 3-way splitter divider 20 and the input of the carrier amplifier $10_C$ and that $TL_{I2}$ between the 3-way splitter 20 and the input of the second peak amplifier $10_{P2}$ are necessary to compensate for the phase delay caused in the output combiner 30. When three amplifiers have sizes whose ratio is simply given by 1:1:1, the first efficiency back-off point is obtained at −6 dB and the maximum efficiency back-off point is provided at −9.5 dB. However, for high-power applications, there is a difficulty to match the output combining scheme to the optimum load impedance of a transistor because the optimum load impedance thereof becomes very small at high power levels when a micro-strip line is hard or substantially impossible to physically implement such low enough characteristic impedance and the second peak amplifier $10_{P2}$ is also hard or impossible to be directly connected with the node between the second λ/4 transmission line $TL_{O2}$ and the third λ/4 transmission line TLo3.

Therefore, for convenience of the circuit implementation, the three-stage Doherty amplifier configuration shown in FIG. 1 may be modified by including of an additional half-wave transmission line at the output of the second peak amplifier $10_{P2}$ and an additional λ/4 transmission line may be included between the second combining node $N_2$ and the amplifier output OUT in order to secure the design flexibility in choosing optimum values of the transmission-line characteristic impedance required at different output power levels.

The present invention provides a modified three-stage Doherty amplifier including a carrier amplifier $10_C$ and two peak amplifiers, $10_{P1}$ and $10_{P2}$, each having an input matching circuit, an output matching circuit, and an offset line, when the carrier amplifier $10_C$ and the peak amplifiers, $10_{P1}$ and $10_{P2}$, are configured to operate such that the peak amplifiers, $10_{P1}$ and $10_{P2}$, switch on sequentially under an increase in input power; an input 3-way splitter 20 is coupled between an input IN of the Doherty amplifier and inputs of the carrier amplifier $10_C$ and the peak amplifiers, $10_{P1}$ and $10_{P2}$, the outputs of the carrier amplifier $10_C$ and the peak amplifiers, $10_{P1}$ and $10_{P2}$, are coupled through an output impedance combiner 30 to the output OUT of the Doherty amplifier. The first peak amplifier $10_{P1}$ is coupled with the second peak amplifier $10_{P2}$ at the first combining node $N_1$ through the λ/4 transmission line $TL_{O2}$ and the third transmission line $TL_{O3}$ with an electrical length of λ/2, and then both peak amplifiers, $10_{P1}$ and $10_{P2}$, are coupled at the second combining node $N_2$ with the carrier amplifier $10_C$ through the transmission lines, $TL_{O1}$ and $TL_{O4}$, respectively. The first peak amplifier $10_{P1}$ is coupled with the input splitter 20 through the λ/4 transmission line $TL_{I2}$, while the carrier amplifier $10_C$ is coupled with the input splitter 20 through the λ/2 transmission line $TL_{I1}$. The λ/4 impedance transformer, which is a λ/4 transmission line $TL_{O5}$, connected between the second combining node $N_2$ and the output of output combiner 30 provides a function of output impedance transformation.

Figure 2:
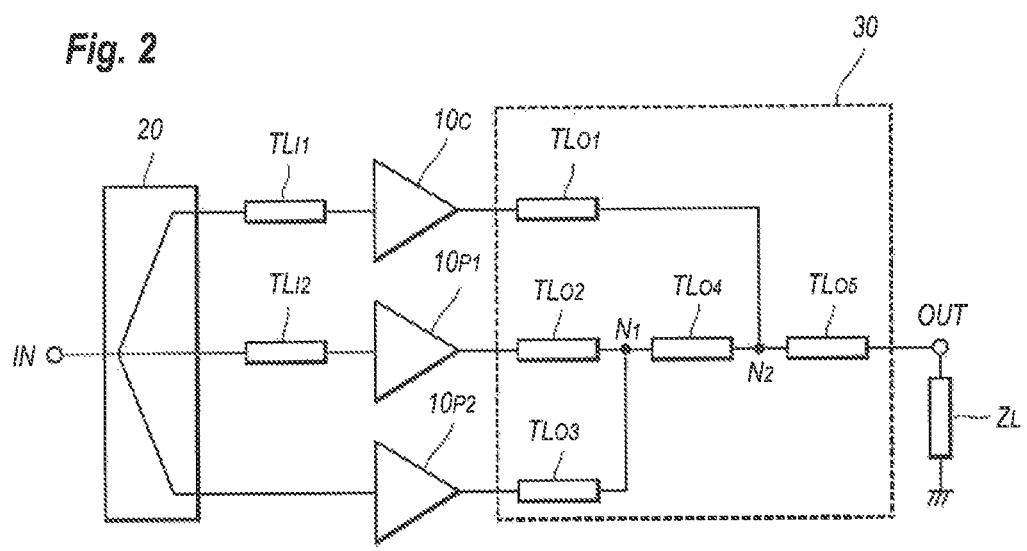
FIG. 2 shows a schematic of a modified three-stage Doherty configuration according to the present invention.

FIG. 2 shows the schematic of a modified three-stage Doherty amplifier according to embodiment of the present invention, where the modifier Doherty amplifier shown in FIG. 2 provides an additional λ/4 transmission line $TL_{O4}$ between the second combining node $N_2$ and the amplifier output OUT for enhancing the design flexibility of choosing optimum values of the transmission-line characteristic impedances required at different output power levels.

Also, the modified Doherty amplifier further includes an additional λ/2 transmission line $TL_{O3}$ at the output of the second peak amplifier $10_{P2}$ to simplify the physical connection of the second peak amplifier $10_{P2}$ with a path for the first peak amplifier $10_{P1}$ without changing impedance conditions under circuit implementation on a printed circuit board. All amplifiers, $10_C$, $10_{P1}$, and $10_{P2}$, include the input matching circuits, the output matching circuits, and the offset lines, which are not illustrated in the figures, necessary to provide high impedance at their outputs for peak amplifiers, $10_{P1}$ and $10_{P2}$, when they are turned off.

All amplifiers, $10_C$, $10_{P1}$ and $10_{P2}$, are turned on at saturation, the carrier amplifier $10_C$ is turned on only to provide efficiency peak at maximum back-off of −9.5 dB when the peak amplifiers, $10_{P1}$ and $10_{P2}$, are turned off; and both the carrier amplifier $10_C$ and the first peak amplifier $10_{P1}$ are turned on to provide efficiency peak at −6 dB. In the latter situation, the λ/2 transmission line $TL_{I1}$ provided at the input of the carrier amplifier $10_C$ and the λ/4 transmission line $TL_{I2}$ set upstream of the first peak amplifier $10_{P1}$ are required to compensate for the phase delay caused in the output combiner 30.

Figure 3:
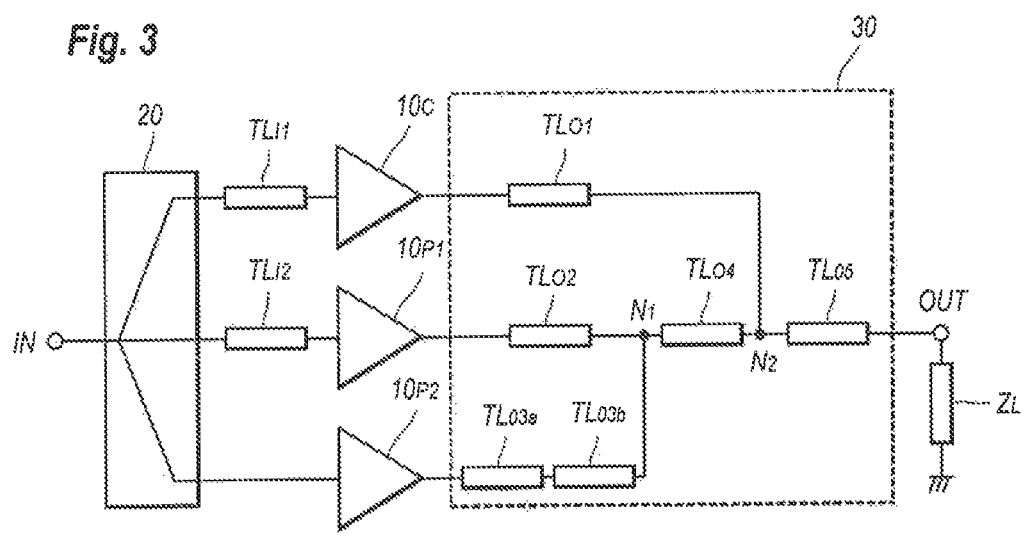
FIG. 3 shows another schematic of the three-stage Doherty amplifier modified from that shown in FIG. 2.

FIG. 3 shows another embodiment of the modified three-stage Doherty amplifier according to the present invention, where the Doherty amplifier shown in FIG. 3 provides, substituted from the λ/2 transmission line $TL_{O3}$ at the output of the second peak amplifier $10_{P2}$ shown in FIG. 2, two λ/4 transmission lines, $TL_{O3a}$ and $TL_{O3b}$, to implement capability in transforming the impedance in the output combiner 30, which may be called as a upstream transmission lien and a downstream transmission line, respectively. In this case, the load impedance seen by the carrier amplifier $10_C$ and two peak amplifiers, $10_{P1}$ and $10_{P2}$, may vary depending on the characteristic impedance of the corresponding λ/4 lines, $TL_{O1}$, $TL_{O2}$, and $TL_{O3a}$, provided in the respective outputs of the amplifiers, $10_C$, $10_{P1}$, and $10_{P2}$.

In a case of a balanced Doherty amplifier where the carrier and two peak amplifiers, $10_C$, $10_{P1}$ and $10_{P2}$ have a ratio in the device size thereof to be equal to 1:1:1 and optimum load impedance of $Z_o$; the characteristic impedance of the λ/4 transmission lines, $TL_{O1}$, $TL_{O2}$, and $TL_{O3a}$, connected with the respective outputs of the carrier and two peak amplifier, $10_C$, $10_{P1}$, and $10_{P2}$, may be set as $Z_1=\sqrt{(Z_oZ_2)}$, where $Z_2$ is the characteristic impedance of the downstream transmission line $TL_{O3b}$ provided in a downstream side of the upstream transmission line $TL_{O3a}$. The downstream transmission line $TL_{O3b}$ is connected with the path for the first peak amplifier $10_{P1}$ between two λ/4 transmission lines, $TL_{O2}$ and TLo4, one of which $TL_{O2}$ has the characteristic impedance $Z_1$, while, the other TLo4 has the characteristic impedance $Z_2/2$, where $Z_2=3Z_3^2/Z_L$ and $Z_3$ is the characteristic impedance of the λ/4 transmission line $TL_{O5}$ connected between the second combining node $N_2$ and the amplifier output OUT.

For the case without impedance transformation in the output combiner 30, when conditions of $Z_3=28.9\Omega$ and $Z_L=50\Omega$ are assumed, a relation of $Z_o=Z_1=Z_2=50\Omega$ may be obtained. However, when other conditions of $Z_3=40.8\Omega$ and $Z_L=50\Omega$ are assumed, the characteristic impedance $Z_2$ of the λ/4 transmission line $TL_{O4}$ is necessary to be increased to 100Ω. In this case, when the λ/4 transmission lines, $TL_{O1}$, $TL_{O2}$, and $TL_{O3a}$, set in the respective outputs of the carrier amplifier and two peak amplifiers, $10_C$, $10_{P1}$, and $10_{P2}$, to be $Z_1=50\Omega$; the load impedance $Z_o$ of the respective amplifiers, $10_C$, $10_{P1}$, and $10_{P2}$, reduces to $Z_o=25\Omega$ which is two times smaller than the value without impedance transformation. The same load impedance of $Z_o=25\Omega$ may be achieved for conditions of $Z_1=35.3\Omega$, $Z_2=50\Omega$, and $Z_3=28.9\Omega$. Generally, depending on the value of $Z_3$ and $Z_1$, the load impedance $Z_o$ may be set to any desired value according to $Z_o=(Z_1/Z_3)^2(Z_L/3)$ for fixed $Z_L$.

What is claimed is:

1. A three-stage Doherty amplifier, comprising:
   a three-way splitter that splits an input signal evenly into three portions;
   a carrier amplifier that receives one of the portions of the input signal split by the three-way splitter, the carrier amplifier always turning on for the input signal;
   first and second peak amplifiers each receiving respective other portions of the input signal split by the three-way splitter, the first peak amplifier turning on when input signal power becomes greater than a first back-off point, the second peak amplifier turning on when the input signal power becomes greater than a second back-off point greater than the first back-off point; and an output combiner that includes a first output transmission line set in a downstream side of the carrier amplifier, a second output transmission line set in a downstream side of the first peak amplifier, a third output transmission line set in a downstream side of the second peak amplifier, a fourth output transmission line set in a downstream side of the second output transmission line and the third output transmission line, and a fifth output transmission line set in a downstream side of the first output transmission line and the fourth output transmission line, wherein the first, second, fourth, and fifth output transmission lines have an electrical length of a quarter-wavelength ($\lambda/4$) and the third output transmission line has an electrical length of a half-wavelength ($\lambda/2$), where $\lambda$ is a wavelength of the input signal.

2. The Doherty amplifier according to claim 1,
wherein the output combiner provides a first combining node and a second combining node, the first combining node combining the second output transmission line with the third output transmission line, the second combining node combining the first output transmission line with the fourth output transmission line.

3. The Doherty amplifier according to claim 2,
wherein the fifth output transmission line is put between the second combining node and an output of the Doherty amplifier.

4. The Doherty amplifier according to claim 1,
further including a first input transmission line and a second input transmission line, the first input transmission line having an electrical length of $\lambda/2$ and provided in an upstream side of the carrier amplifier, and the second input transmission line having an electrical length of $\lambda/4$ and provided in an upstream side of the first peak amplifier.

5. The Doherty amplifier according to claim 1,
wherein the carrier amplifier, the first peak amplifier, and the second peak amplifier each implement devices with sizes substantially equal to each other.

6. The Doherty amplifier according to claim 5,
wherein the carrier amplifier, and the first and second peak amplifiers include input matching circuits, output matching circuits, and offset lines for adjusting phases of signals output from the carrier amplifier and the first and second peak amplifiers.

7. The Doherty amplifier according to claim 1,
wherein the third transmission line includes an upstream transmission line and a downstream transmission line connected in series to each other, the upstream transmission line and the downstream transmission line each having an electrical length of $\lambda/4$.

8. The Doherty amplifier according to claim 7,
wherein the first output transmission line, the second output transmission line and the upstream transmission line have equal characteristic impedances.

9. The Doherty amplifier according to claim 8,
wherein the carrier amplifier and the first and second peak amplifiers have load impedance of $(Z_1/Z_3)^2 \times (Z_L/3)$ common to each other, where $Z_1$ is impedance of the first, second and upstream transmission lines, $Z_3$ is impedance of the fifth transmission line, and $Z_L$ is load impedance.

* * * * *